(12) United States Patent
Yoon et al.

(10) Patent No.: US 10,541,350 B2
(45) Date of Patent: Jan. 21, 2020

(54) LIGHT EMITTING DEVICE INCLUDING LIGHT REFLECTION PATTERN AND WAVELENGTH CONVERTING LAYER

(71) Applicant: SAMSUNG ELECTRONICS CO., LTD., Suwon-si (KR)

(72) Inventors: Ju Heon Yoon, Hwaseong-si (KR); Jae In Sim, Hwaseong-si (KR); Tae Hun Kim, Hwaseong-si (KR); Gi Bum Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/985,236

(22) Filed: May 21, 2018

(65) Prior Publication Data

US 2019/0181297 A1   Jun. 13, 2019

(30) Foreign Application Priority Data

Dec. 7, 2017 (KR) .................. 10-2017-0167530

(51) Int. Cl.
| | |
|---|---|
| *H01L 33/10* | (2010.01) |
| *H01L 33/38* | (2010.01) |
| *H01L 33/50* | (2010.01) |

(52) U.S. Cl.
CPC ............ *H01L 33/10* (2013.01); *H01L 33/387* (2013.01); *H01L 33/50* (2013.01)

(58) Field of Classification Search
CPC ........ H01L 33/10; H01L 33/387; H01L 33/50
USPC .................................................. 257/98–100
See application file for complete search history.

(56) References Cited

U.S. PATENT DOCUMENTS

| | | | |
|---|---|---|---|
| 8,406,581 B2 | 3/2013 | Hamamura et al. | |
| 9,620,669 B2 | 4/2017 | Sugizaki et al. | |
| 9,653,659 B2 | 5/2017 | Ikegami et al. | |
| 2012/0128292 A1 | 5/2012 | Hamamura et al. | |
| 2015/0017750 A1 | 1/2015 | Sugizaki et al. | |
| 2015/0207046 A1 | 7/2015 | Ikegami et al. | |
| 2016/0093780 A1* | 3/2016 | Beppu ................ | H01L 21/3213 257/98 |
| 2017/0005245 A1* | 1/2017 | Hsu ..................... | H01L 33/60 |
| 2017/0092825 A1 | 3/2017 | Bando | |
| 2019/0088824 A1* | 3/2019 | Kim .................... | H01L 33/56 |

FOREIGN PATENT DOCUMENTS

| | | |
|---|---|---|
| JP | 2003-273408 A | 9/2003 |
| JP | 2013-012559 A | 1/2013 |
| JP | 2016-197760 A | 11/2016 |

\* cited by examiner

*Primary Examiner* — Matthew E Warren
(74) *Attorney, Agent, or Firm* — Sughrue Mion, PLLC (57) ABSTRACT

A light-emitting device includes a light-emitting chip having a first surface and a second surface. A first light reflection pattern is formed on the second surface. A plurality of terminals are disposed to be connected to the light-emitting chip by passing through the first light reflection pattern. A second light reflection pattern is formed on side surfaces of the light-emitting chip and the first light reflection pattern. A light-transmitting pattern is formed between the light-emitting chip and the second light reflection pattern and extends between the first light reflection pattern and the second light reflection pattern. A wavelength conversion layer is formed on the first surface of the light-emitting chip.

12 Claims, 10 Drawing Sheets

LIGHT EMITTING DEVICE INCLUDING LIGHT REFLECTION PATTERN AND WAVELENGTH CONVERTING LAYER

CROSS-REFERENCE TO THE RELATED APPLICATION

This application claims priority from Korean Patent Application No. 10-2017-0167530, filed on Dec. 7, 2017, in the Korean Intellectual Property Office, the disclosure of which is incorporated herein by reference in its entirety.

BACKGROUND

1. Field

Apparatuses and methods consistent with the according to an exemplary embodiment of the inventive concept relate to a light-emitting device including a light reflection pattern and a wavelength conversion layer, and a method of fabricating the same.

2. Discussion of Related Art

Various studies are underway to improve the luminous flux of a light-emitting device. The light-emitting device includes a light-emitting chip and power supply terminals. When power is supplied through the power supply terminals, the light-emitting chip emits light. It is advantageous for improving the luminous flux of the light-emitting device when rays of light emitted from the light-emitting chip in a desired direction are gathered. There is a necessity of a new technique for simplifying a process and also improving the luminous flux of the light-emitting device.

SUMMARY

The exemplary embodiments of the inventive concept are directed to a light-emitting device that has an improved luminous flux and is advantageous for high-density integration.

In addition, the exemplary embodiments of the inventive concept are directed to a method of fabricating a light-emitting device that has an improved luminous flux and is advantageous for high-density integration.

A light-emitting device according to an exemplary embodiment of the inventive concept may include a light-emitting chip having a first surface and a second surface opposite to the first surface. A first light reflection pattern may be formed on the second surface. A plurality of terminals may be disposed to be connected to the light-emitting chip by passing through the first light reflection pattern. A second light reflection pattern may be formed on side surfaces of the light-emitting chip and the first light reflection pattern. A light-transmitting pattern may be formed between the light-emitting chip and the second light reflection pattern, and may extend between the first light reflection pattern and the second light reflection pattern. A wavelength conversion layer may be formed on the first surface of the light-emitting chip.

A light-emitting device according to an exemplary embodiment of the present inventive concept may include a light-emitting chip having a first surface and a second surface opposite to the first surface. A first light reflection pattern may be formed on the second surface. A plurality of terminals may be disposed to be connected to the light-emitting chip by passing through the first light reflection pattern. A second light reflection pattern may be formed on side surfaces of the light-emitting chip and the first light reflection pattern. A wavelength conversion layer may be formed on the first surface of the light-emitting chip. Surfaces of the first light reflection pattern and the plurality of terminals may be substantially coplanar, the side surfaces of the light-emitting chip and the first light reflection pattern may be substantially coplanar, and the second light reflection pattern may be in contact with the first light reflection pattern.

A light-emitting device according to an exemplary embodiment of the present inventive concept may include a light-emitting chip having a first surface and a second surface opposite to the first surface. A light reflection pattern may be formed on the second surface. A plurality of terminals may be disposed to be connected to the light-emitting chip by passing through the light reflection pattern. A wavelength conversion layer may be disposed to cover the first surface of the light-emitting chip and may be in contact with a side surface of light-emitting chip and a side surface of the light reflection pattern.

DETAILED DESCRIPTION OF EXEMPLARY EMBODIMENTS

Various exemplary embodiments of the inventive concept will be described more fully hereinafter with reference to the accompanying drawings. The inventive concept may, however, be embodied in many different forms and should not be construed as limited to the exemplary embodiments set forth herein. Rather, these exemplary embodiments are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "over," "above," "upper," "top," and "bottom" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 13 are cross-sectional views illustrating a light-emitting device according to exemplary embodiments of the inventive concept.

Figure 1:
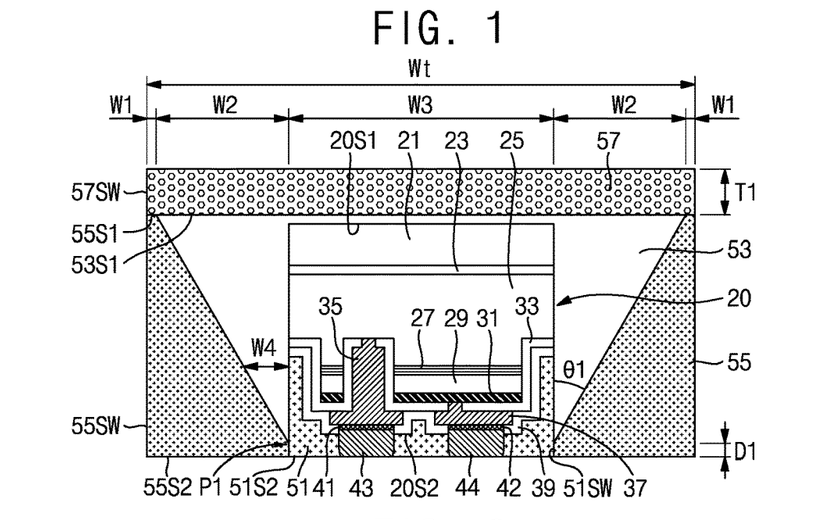
FIGS. 1 to 13 are cross-sectional views illustrating a light-emitting device according to exemplary embodiments of the inventive concept.

Referring to FIG. 1, a light-emitting device according to exemplary embodiments of the inventive concept may include a light-emitting chip 20, a first terminal 43, a second terminal 44, a first light reflection pattern 51, a light-transmitting pattern 53, a second light reflection pattern 55, and a wavelength conversion layer 57. The light-emitting chip 20 may include a substrate 21, a buffer layer 23, a first semiconductor layer 25, an active layer 27, a second semiconductor layer 29, an upper electrode 31, a first insulating layer 33, a first interconnection 35, a second interconnection 37, and a second insulating layer 39. In the light-emitting chip 20, a first surface 20S1 and a second surface 20S2 that is opposite to the first surface 20S1 may be defined. A first metal layer 41 may be formed between the first terminal 43 and the first interconnection 35. A second metal layer 42 may be formed between the second terminal 44 and the second interconnection 37.

The first light reflection pattern 51, the first terminal 43, and the second terminal 44 may be disposed under the second surface 20S2 of the light-emitting chip 20. The first terminal 43 may pass through the first light reflection pattern 51, and may be connected to the first interconnection 35 via the first metal layer 41. The second terminal 44 may pass through the first light reflection pattern 51, and may be connected to the second interconnection 37 via the second metal layer 42. Side surfaces of the light-emitting chip 20 and the first light reflection pattern 51 may be substantially coplanar. The light-emitting chip 20, the first light reflection pattern 51, the first terminal 43, and the second terminal 44 may correspond to a chip scale package (CSP). A configuration of the light-emitting chip 20, the first light reflection pattern 51, the first terminal 43, and the second terminal 44 may be advantageous for high-density integration and process simplification.

The light-transmitting pattern 53 may cover the first surface 20S1 and the side surfaces of the light-emitting chip 20, and may extend to the side surfaces of the first light reflection pattern 51. The side surfaces of the light-emitting chip 20 may be completely covered by the light-transmitting pattern 53. The light-transmitting pattern 53 may come in direct contact with the side surfaces of the light-emitting chip 20 and the side surfaces of the first light reflection pattern 51. A lowermost end P1 of the light-transmitting pattern 53 may be formed at a lower level than at least some regions of the second surface 20S2. The lowermost end P1 of the light-transmitting pattern 53 may be formed at a higher level than a bottom surface 51S2 of the first light reflection pattern 51. The light-transmitting pattern 53 may have a decreasing width toward the lowermost end P1. The light-transmitting pattern 53 may include an inwardly inclined side surface.

In an exemplary embodiment, the lowermost end P1 of the light-transmitting pattern 53 may be construed as one end of the light-transmitting pattern 53. The one end of the light-transmitting pattern 53 may be arranged adjacent to the bottom surface 51S2 of the first light reflection pattern 51. In an exemplary embodiment, the light-transmitting pattern 53 may cover the side surfaces and the first surface 20S1 of the light-emitting chip 20, and may be disposed between a side surface of the first light reflection pattern 51 and the second light reflection pattern 55.

The second light reflection pattern 55 may be formed outside the light-transmitting pattern 53. A lower portion of the second light reflection pattern 55 may come in direct contact with a part of the side surface 51SW of the first light reflection pattern 51. A bottom surface 55S2 of the second light reflection pattern 55 and the bottom surface 51S2 of the first light reflection pattern 51 may be substantially coplanar. A top surface 55S1 of the second light reflection pattern 55 and a top surface 53S1 of the light-transmitting pattern 53 may be substantially coplanar. The second light reflection pattern 55 may come in direct contact with the light-transmitting pattern 53.

An interface between the second light reflection pattern 55 and the light-transmitting pattern 53 may have various inclinations. One surface of the second light reflection pattern 55 may have a first angle θ1 with respect to the side surface of the light-emitting chip 20 or the side surface of the first light reflection pattern 51. The first angle θ1 may be 20 degrees to 70 degrees. In an exemplary embodiment, the first angle θ1 may be 45 degrees to 70 degrees. For example, the first angle θ1 may be about 45 degrees or about 55 degrees. The bottom surface 51S2 of the first light reflection pattern 51, the bottom surface 55S2 of the second light reflection pattern 55, a bottom surface of the first terminal 43, and a bottom surface of the second terminal 44 may be exposed in substantially the same plane.

The wavelength conversion layer 57 may be formed on the second light reflection pattern 55 and the light-transmitting pattern 53. The wavelength conversion layer 57 may come in direct contact with the second light reflection pattern 55 and the light-transmitting pattern 53. A side surface 57SW of the wavelength conversion layer 57 and a side surface 55SW of the second light reflection pattern 55 may be substantially coplanar. The wavelength conversion layer 57 may have a first thickness T1. The first thickness T1 may be 30 μm to 300 μm. In an exemplary embodiment, the first thickness T1 may be about 90 μm.

In an exemplary embodiment, the top surface 55S1 of the second light reflection pattern 55 may have a first width W1. A horizontal distance between a point at the top surface 53S1 of the light-transmitting pattern 53 directly above the side surface of the light-emitting chip 20 and an outermost end of the light-transmitting pattern 53 may be a second width W2. A horizontal width of the light-emitting chip 20 may be a third width W3. The light-emitting chip 20 may be in a rectangular shape in a plan view. The third width W3 may correspond to a length of a single side of the light-emitting chip 20. A total width Wt of the light-emitting device according to exemplary embodiments of the inventive concept may be defined as 2× the first width W1+2× the second width W2+the third width W3. A horizontal width of the wavelength conversion layer 57 may be substantially the same as the total width Wt of the light-emitting device. A ratio of the first width W1 to the second width W2 may be 1:1 to 1:10. In an exemplary embodiment, the ratio of the first width W1 to the second width W2 may be 1:2. A ratio of the first width W1 to the second width W2 to the third width W3 may be 1:1:10 to 1:10:26. In an exemplary embodiment, the ratio of the first width W1 to the second width W2 to the third width W3 may be 1:2:12.

A horizontal width of the light-transmitting pattern 53 adjacent to the side surface of the first light reflection pattern 51 may be defined as a fourth width W4. The fourth width W4 may be smaller than the second width W2. The light-transmitting pattern 53 may have a width that decreases toward the bottom surface 51S2 of the first light reflection pattern 51. The light-transmitting pattern 53 may have a width that increases toward the wavelength conversion layer 57. The lowermost end P1 of the light-transmitting pattern 53 may be arranged at a level as much as a first height D1 higher than the bottom surface 51S2 of the first light reflection pattern 51. The first height D1 may be 10 μm to 30 μm.

A combination of the first light reflection pattern 51, the light-transmitting pattern 53, and the second light reflection pattern 55 may maximize efficiency in extracting light emitted from the light-emitting chip 20.

Figure 2:
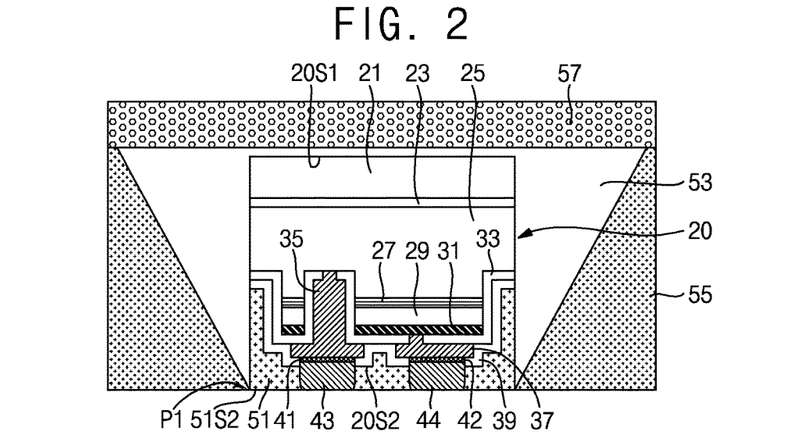

Referring to FIG. 2, the lowermost end P1 of the light-transmitting pattern 53 may be formed adjacent to a lower end of the side surface of the first light reflection pattern 51. In an exemplary embodiment, the lowermost end P1 of the light-transmitting pattern 53 may be formed at substantially the same level as the bottom surface 51S2 of the first light reflection pattern 51.

Figure 3:
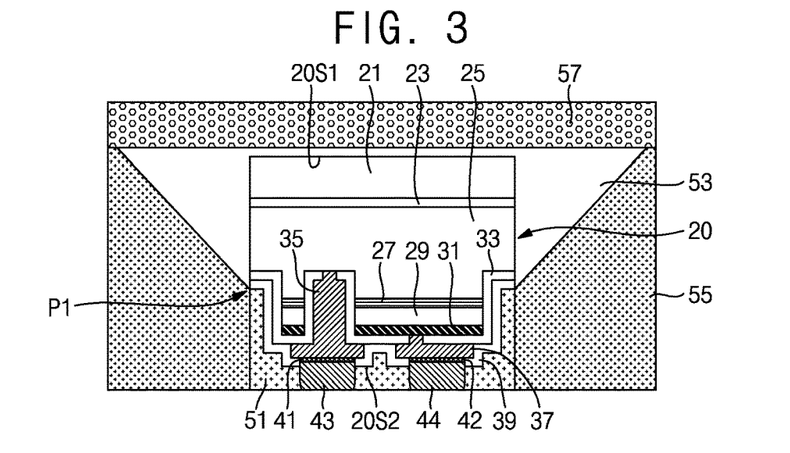

Referring to FIG. 3, the lowermost end P1 of the light-transmitting pattern 53 may be formed adjacent to an upper end of the side surface of the first light reflection pattern 51. In an exemplary embodiment, the lowermost end P1 of the light-transmitting pattern 53 may be formed at substantially the same level as the upper end of the side surface of the first light reflection pattern 51. The second light reflection pattern 55 may come in contact with the side surface of the first light reflection pattern 51.

Figure 4:
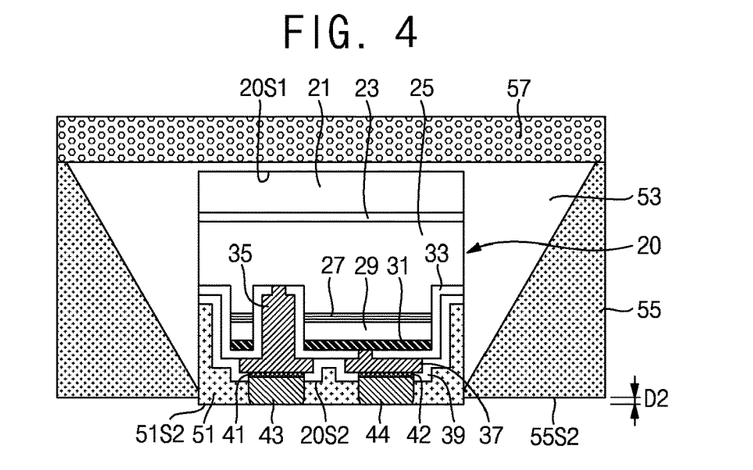

Referring to FIG. 4, the bottom surface 55S2 of the second light reflection pattern 55 may be formed at a higher level than the bottom surface 51S2 of the first light reflection pattern 51. A step between the bottom surface 55S2 of the second light reflection pattern 55 and the bottom surface 51S2 of the first light reflection pattern 51 may be indicated by a second height D2. The second height D2 may be 5 μm to 500 μm. The step may be used as a reference for installing the light-emitting device in a specific pattern of a circuit board. In an exemplary embodiment, the second height D2 of the step may be 10 μm to 100 μm.

Figure 5:
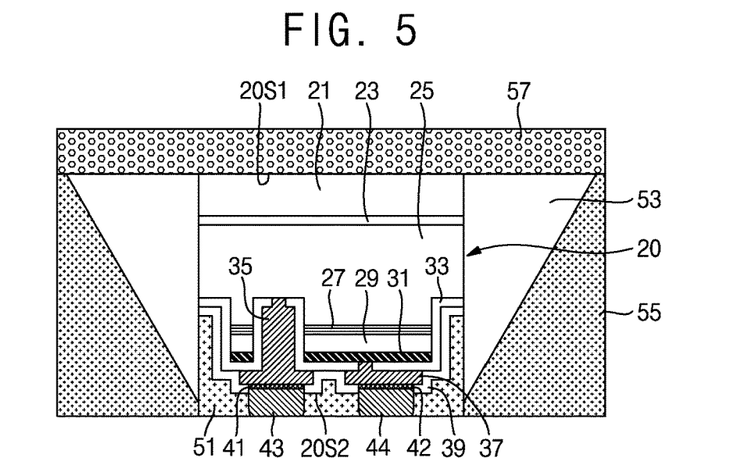

Referring to FIG. 5, the top surface of the light-transmitting pattern 53 may be formed at substantially the same level as the first surface 20S1 of the light-emitting chip 20. The top surface of the second light reflection pattern 55, the top surface of the light-transmitting pattern 53, and the first surface 20S1 of the light-emitting chip 20 may be substantially coplanar. A bottom surface of the wavelength conversion layer 57 may come in direct contact with the top surface of the second light reflection pattern 55, the top surface of the light-transmitting pattern 53, and the first surface 20S1 of the light-emitting chip 20. The horizontal width of the wavelength conversion layer 57 may be greater than the horizontal width of the light-emitting chip 20. The wavelength conversion layer 57 may completely cover the first surface 20S1 of the light-emitting chip 20 and extend onto the second light reflection pattern 55 and the light-transmitting pattern 53.

Figure 6:
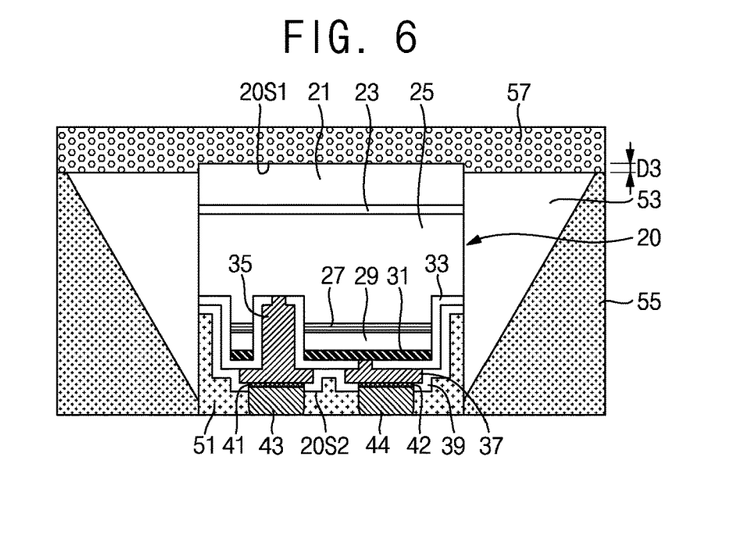

Referring to FIG. 6, a lowermost end of the wavelength conversion layer 57 may be formed at a lower level than the first surface 20S1 of the light-emitting chip 20. The wavelength conversion layer 57 may cover a part of the side surfaces of the light-emitting chip 20. The top surface of the light-transmitting pattern 53 may be formed at a lower level than the first surface 20S1 of the light-emitting chip 20. This may prevent peeling of the wavelength conversion layer 57 by improving bonding strength between the wavelength conversion layer 57 and the light-emitting chip 20, and may also improve the effect of radiating heat generated by the light-emitting chip 20 through the wavelength conversion layer 57. The wavelength conversion layer 57 may be formed by applying pressure to a soft film or a soft material layer. A step between the first surface 20S1 of the light-emitting chip 20 and the lowermost end of the wavelength conversion layer 57 may be indicated by a third height D3, which may be about 1 μm to 30 μm.

Figure 7:
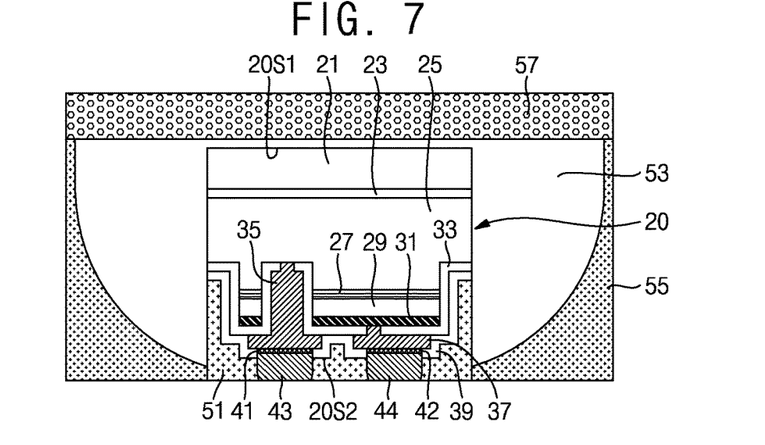

Referring to FIG. 7, the interface between the light-transmitting pattern 53 and the second light reflection pattern 55 may have a curved shape. In an exemplary embodiment, a part of the interface between the light-transmitting pattern 53 and the second light reflection pattern 55 may be formed to be round. At least a part of the second light reflection pattern 55 may have a concave shape with respect to the side surfaces of the light-emitting chip 20 or the side surface of the first light reflection pattern 51.

Figure 8:
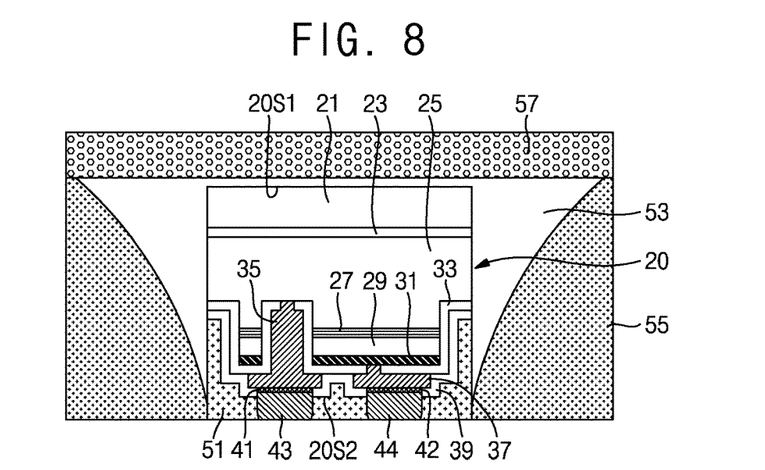

Referring to FIG. 8, the interface between the light-transmitting pattern 53 and the second light reflection pattern 55 may be formed to be round. At least a part of the second light reflection pattern 55 may have a convex shape with respect to the side surfaces of the light-emitting chip 20 or the side surface of the first light reflection pattern 51.

Figure 9:
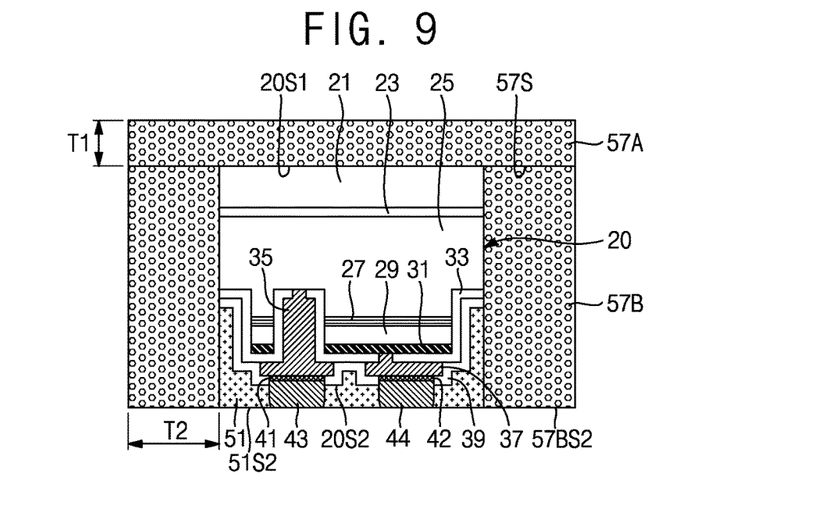

Referring to FIG. 9, a first wavelength conversion layer 57A may be formed on the first surface 20S1 of the light-emitting chip 20, and a second wavelength conversion layer 57B may be formed next to the side surfaces of the light-emitting chip 20 and the side surfaces of the first light reflection pattern 51. The second wavelength conversion layer 57B may come in direct contact with the side surfaces of the light-emitting chip 20 and the side surfaces of the first light reflection pattern 51. A bottom surface 57BS2 of the second wavelength conversion layer 57B, the bottom surface 51S2 of the first light reflection pattern 51, the bottom surface of the first terminal 43, and the bottom surface of the second terminal 44 may be exposed in substantially the same plane.

The first wavelength conversion layer 57A may have a first thickness T1. The first thickness T1 may be 30 µm to 300 µm. In an exemplary embodiment, the first thickness T1 may be about 90 µm. A horizontal width of the second wavelength conversion layer 57B may be defined as a second thickness T2. A ratio of the first thickness T1 to the second thickness T2 may be 1:2 to 1:5.

A top surface of the second wavelength conversion layer 57B and the first surface 20S1 of the light-emitting chip 20 may be substantially coplanar. A bottom surface of the first wavelength conversion layer 57A may come in contact with the top surface of the second wavelength conversion layer 57B and the first surface 20S1 of the light-emitting chip 20. An interface may be formed between the bottom surface of the first wavelength conversion layer 57A and the top surface of the second wavelength conversion layer 57B. The interface between the bottom surface of the first wavelength conversion layer 57A and the top surface of the second wavelength conversion layer 57B and the first surface 20S1 may be substantially coplanar. Side surfaces of the first wavelength conversion layer 57A and the second wavelength conversion layer 57B may be substantially coplanar.

In an exemplary embodiment, the first light reflection pattern 51 may correspond to a light reflection pattern.

Figure 10:
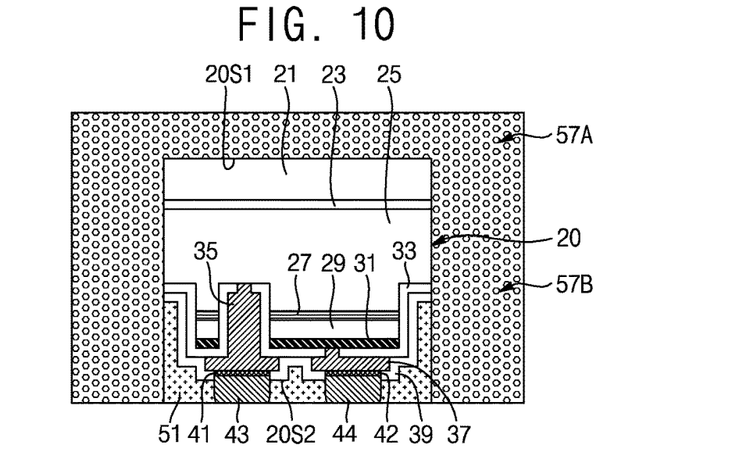

Referring to FIG. 10, the first wavelength conversion layer 57A and the second wavelength conversion layer 57B may be integrally formed. The second wavelength conversion layer 57B may be a continuous structure of the first wavelength conversion layer 57A.

Figure 11:
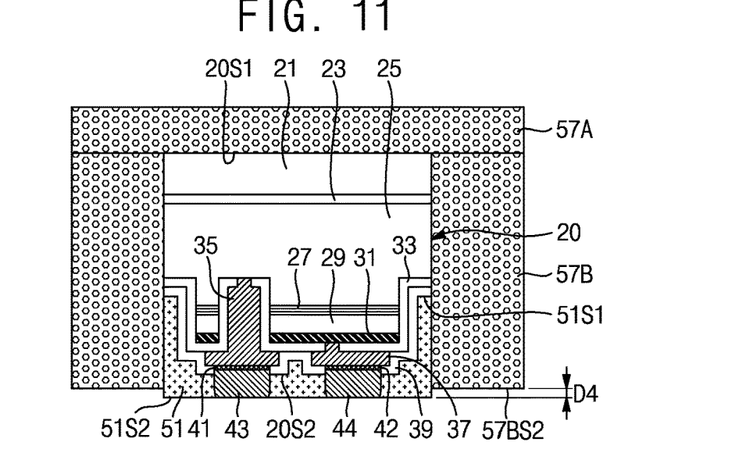

Referring to FIG. 11, the bottom surface 57BS2 of the second wavelength conversion layer 57B may be formed at a higher level than the bottom surface 51S2 of the first light reflection pattern 51. A step between the bottom surface 57BS2 of the second wavelength conversion layer 57B and the bottom surface 51S2 of the first light reflection pattern 51 may be indicated by a fourth height D4, which may be 10 µm to 30 µm. The bottom surface 57BS2 of the second wavelength conversion layer 57B may be formed at a level between the bottom surface 51S2 and a top surface 51S1 of the first light reflection pattern 51.

Figure 12:
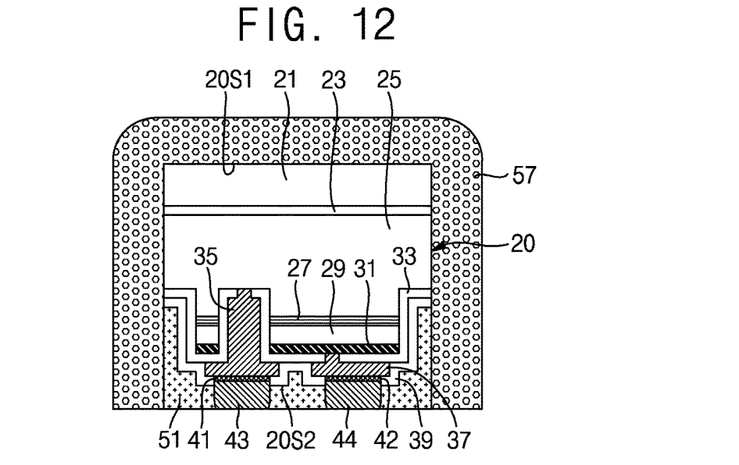

Referring to FIG. 12, upper corners of the wavelength conversion layer 57 may be formed to be round.

Figure 13:
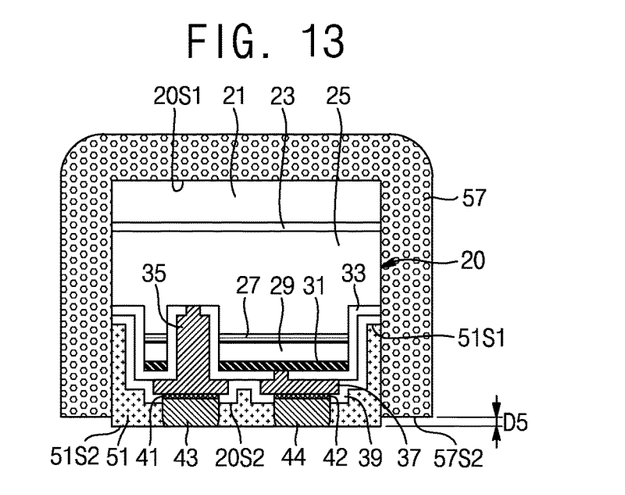

Referring to FIG. 13, a lowermost end 57S2 of the wavelength conversion layer 57 may be formed at a higher level than the bottom surface 51S2 of the first light reflection pattern 51. A step between the lowermost end 57S2 of the wavelength conversion layer 57 and the bottom surface 51S2 of the first light reflection pattern 51 may be indicated by a fifth fourth height D5, which may be 10 µm to 30 µm. The lowermost end 57S2 of the wavelength conversion layer 57 may be formed at a level between the bottom surface 51S2 and the top surface 51S1 of the first light reflection pattern 51.

FIGS. 14 to 22 are cross-sectional views illustrating a method of fabricating a light-emitting device according to exemplary embodiments of the inventive concept.

Figure 14:
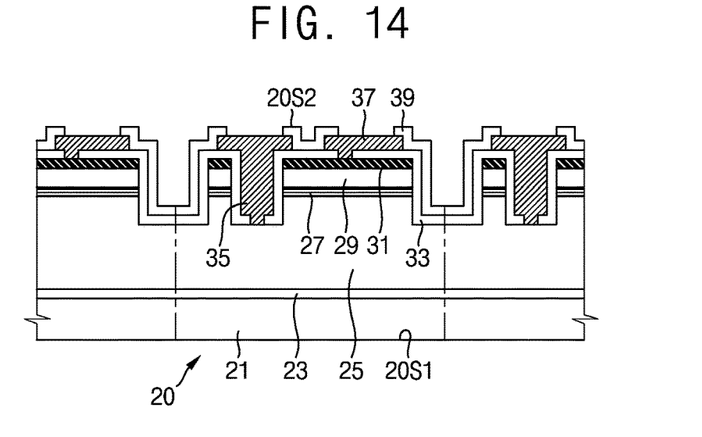
FIGS. 14 to 27 are cross-sectional views illustrating a method of fabricating a light-emitting device according to exemplary embodiments of the inventive concept.

Referring to FIG. 14, a plurality of light-emitting chips 20 may be formed. Each of the plurality of light-emitting chips 20 may include a substrate 21, a buffer layer 23, a first semiconductor layer 25, an active layer 27, a second semiconductor layer 29, an upper electrode 31, a first insulating layer 33, a first interconnection 35, a second interconnection 37, and a second insulating layer 39. In each of the plurality of light-emitting chips 20, a first surface 20S1 and a second surface 20S2 opposite to the first surface 20S1 may be defined.

According to exemplary embodiments, the substrate 21 may include a material with excellent transmittance. The substrate 21 may include sapphire ($Al_2O_3$), spinel ($MgAl_2O_4$), GaN, SiC, ZnO, ZnS, GaP, $SiO_2$, a silicon resin, an epoxy resin, a polyimide resin, ceramics, AlN, or a combination thereof. In an exemplary embodiment, the substrate 21 may include sapphire. The buffer layer 23 may be formed on the substrate 21. The buffer layer 23 may serve to relieve stress between the substrate 21 and the first semiconductor layer 25. The buffer layer 23 may be formed on the substrate 21 using an epitaxial growth method. The buffer layer 23 may serve to mitigate crystalline defects between the substrate 21 and the first semiconductor layer 25. The buffer layer 23 may include at least some of the materials of the substrate 21 and the first semiconductor layer 25. In an exemplary embodiment, the buffer layer 23 may include AlN. The buffer layer 23 may be omitted.

The first semiconductor layer 25 may be formed on the buffer layer 23. The first semiconductor layer 25 may include an n-type semiconductor layer. The first semiconductor layer 25 may include a material represented by $Al_a In_b Ga_{(1-a-b)}N$ ($0 \leq a \leq 1$, $0 \leq b \leq 1$, and $0 \leq a+b \leq 1$). In an exemplary embodiment, the first semiconductor layer 25 may include a GaN layer containing n-type impurities. The n-type impurities may include Si, Ge, Sn, Se, Te, or a combination thereof. The first semiconductor layer 25 may be formed on the buffer layer 23 using an epitaxial growth method.

The active layer 27 may be formed on the first semiconductor layer 25. The active layer 27 may include a single quantum well (SQW) structure, a multi-quantum well (MQW) structure, a nano-rod structure, a quantum-wire structure, a quantum dot structure, or a combination thereof. In an exemplary embodiment, the active layer 27 may include an MQW structure in which quantum well layers and quantum barrier layers are alternately stacked. The quantum well layers/quantum barrier layers may have one or more paired structures of InGaN/GaN, InGaN/InGaN, GaN/AlGaN, InAlGaN/GaN, GaAs(InGaAs)/AlGaAs, and GaP(InGaP)/AlGaP. The quantum well layers may include a material with a lower band gap than the quantum barrier layers. The active layer 27 may be formed on the first semiconductor layer 25 using an epitaxial growth method.

The second semiconductor layer 29 may be formed on the active layer 27. The second semiconductor layer 29 may include a p-type semiconductor layer. The second semiconductor layer 29 may include a material represented by $Al_aIn_bGa_{(1-a-b)}N$ ($0 \le a \le 1$, $0 \le b \le 1$, and $0 \le a+b \le 1$). In an exemplary embodiment, the second semiconductor layer 29 may include a GaN layer containing p-type impurities. The p-type impurities may include Mg, Zn, Ca, Sr, Ba, or a combination thereof. The second semiconductor layer 29 may be formed on the active layer 27 using an epitaxial growth method. In an exemplary embodiment, the buffer layer 23, the first semiconductor layer 25, the active layer 27, and the second semiconductor layer 29 may be formed through an in-situ process.

The upper electrode 31 may cover the second semiconductor layer 29. The upper electrode 31 may come in direct contact with the second semiconductor layer 29. The upper electrode 31 may include a metal layer such as silver (Ag).

The first insulating layer 33 may cover the upper electrode 31 and surround side surfaces of the first interconnection 35 and the second interconnection 37. The first insulating layer 33 may include an insulating material such as silicon oxide, silicon nitride, silicon oxynitride, or a combination thereof.

The first interconnection 35 and the second interconnection 37 may be formed on the insulating layer 33. The first interconnection 35 and the second interconnection 37 may include a plurality of contact plugs, a plurality of horizontal interconnections, and a plurality of pads. The first interconnection 35 and the second interconnection 37 may include a metal, a metal nitride, a metal oxide, a metal silicide, conductive carbon, or a combination thereof. The first interconnection 35 and the second interconnection 37 may include a plurality of different material layers.

The first interconnection 35 may pass through the first insulating layer 33, the upper electrode 31, the second semiconductor layer 29, and the active layer 27 and come in direct contact with the first semiconductor layer 25. A lowermost end of the first interconnection 35 may be formed at a lower level than an uppermost end of the first semiconductor layer 25. The first insulating layer 33 may be interposed between the first interconnection 35 and the upper electrode 31, interposed between the first interconnection 35 and the second semiconductor layer 29, and interposed between the first interconnection 35 and the active layer 27. The second interconnection 37 may pass through the first insulating layer 33 and come in direct contact with the upper electrode 31. The second interconnection 37 may be formed to be spaced apart from the first interconnection 35.

The second insulating layer 39 that exposes a part of the first interconnection 35 and a part of the second interconnection 37 may be formed on the first insulating layer 33. The second insulating layer 39 may include an insulating material such as silicon oxide, silicon nitride, silicon oxynitride, and the like. One surface of the substrate 21 may be exposed at the first surface 20S1. The second insulating layer 39, a part of the first interconnection 35, and a part of the second interconnection 37 may be exposed at the second surface 20S2.

Figure 15:
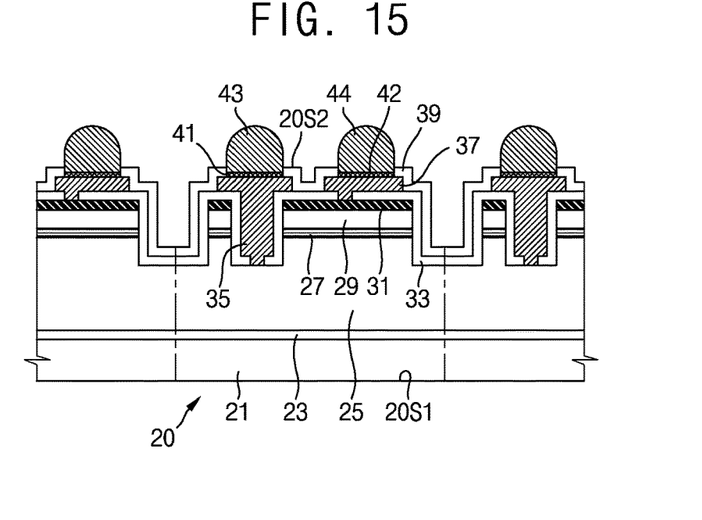

Referring to FIG. 15, a first metal layer 41, a second metal layer 42, a first terminal 43, and a second terminal 44 may be formed on the first interconnection 35 and the second interconnection 37. The first metal layer 41 and the second metal layer 42 may correspond to under bump metals (UBMs). In an exemplary embodiment, the first metal layer 41 and the second metal layer 42 may include Ti, Ni, or a combination thereof. The first terminal 43 and the second terminal 44 may include a metal, a metal nitride, a metal oxide, a metal silicide, conductive carbon, or a combination thereof. In an exemplary embodiment, the first terminal 43 and the second terminal 44 may include solder bumps. The first terminal 43 and the second terminal 44 may include tin-silver-copper (Sn—Ag—Cu).

The first metal layer 41 may be formed on an exposed surface of the first interconnection 35. The second metal layer 42 may be formed on an exposed surface of the second interconnection 37. The first terminal 43 may be formed on the first metal layer 41, and the second terminal 44 may be formed on the second metal layer 42. The first terminal 43 and the second terminal 44 may protrude to a higher level than the second insulating layer 39. Upper sides of the first terminal 43 and the second terminal 44 may be formed to be round.

Figure 16:
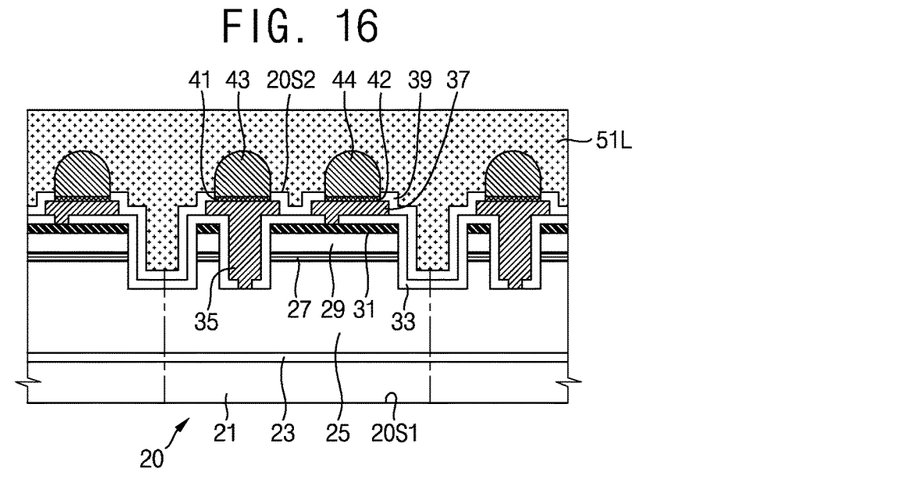

Referring to FIG. 16, a first light reflection layer 51L may be formed on the second surfaces 20S2 of the plurality of light-emitting chips 20. The first light reflection layer 51L may cover the second insulating layer 39, the first terminal 43, and the second terminal 44. According to exemplary embodiments, the first light reflection layer 51L may include $TiO_2$, $TaO_2$, $ZrO_2$, $SiO_2$, $Al_2O_3$, $Al(OH)_3$, $MgCO_3$, $ZnO_2$, $Nb_2O_5$, MgO, $Mg(OH)_2$, SrO, $In_2O_3$, HFO, SeO, $Y_2O_3$, SiN, AlN, AlON, $MgF_2$, or a combination thereof.

In an exemplary embodiment, the first light reflection layer 51L may include $TiO_2$. A process of forming the first light reflection layer 51L may include a process of dispensing a liquid or flexible material onto the second surface 20S2 and a process of curing the liquid or flexible material. The first light reflection layer 51L may have a reflectance of 10% to 97%. For example, a material such as WR-3100, WR-3110, WR-3120 (Dow Chemical Company), or a combination thereof may be used as a material for forming the first light reflection layer 51L.

Figure 17:
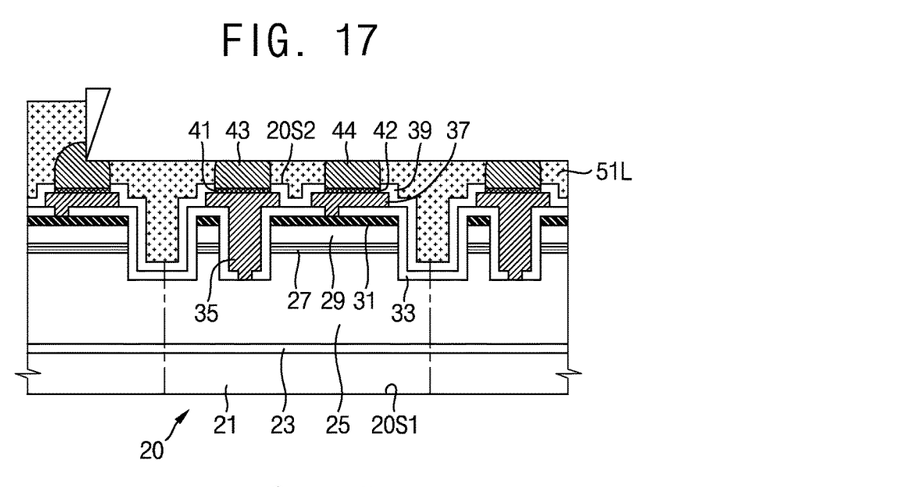

Referring to FIG. 17, the first light reflection layer 51L, the first terminal 43, and the second terminal 44 may be partially removed using a planarization process. Top surfaces of the first light reflection layer 51L, the first terminal 43, and the second terminal 44 may be exposed in substantially the same plane.

Figure 18:
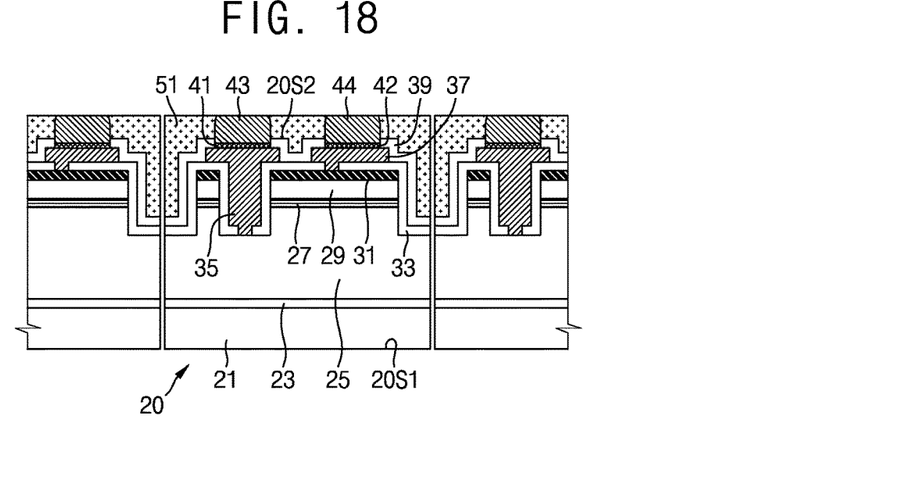

Referring to FIG. 18, the plurality of light-emitting chips 20 may be separated from each other using a separation process. During the process of separating the plurality of light-emitting chips 20 from one another, the first light reflection layer 51L may also be divided such that the first light reflection patterns 51 may be formed. Each of the plurality of light-emitting chips 20 may include the first surface 20S1 and the second surface 20S2. The first light reflection pattern 51, the first terminal 43, and the second terminal 44 may be formed on the second surface 20S2. Top surfaces of the first light reflection pattern 51, the first terminal 43, and the second terminal 44 may be exposed in substantially the same plane. A side surface of a selected one of the plurality of light-emitting chips 20 and a side surface of the first light reflection pattern 51 may be substantially coplanar. The process of separating the plurality of light-emitting chips 20 may include a scribing process, a breaking process, or a combination thereof.

Figure 19:
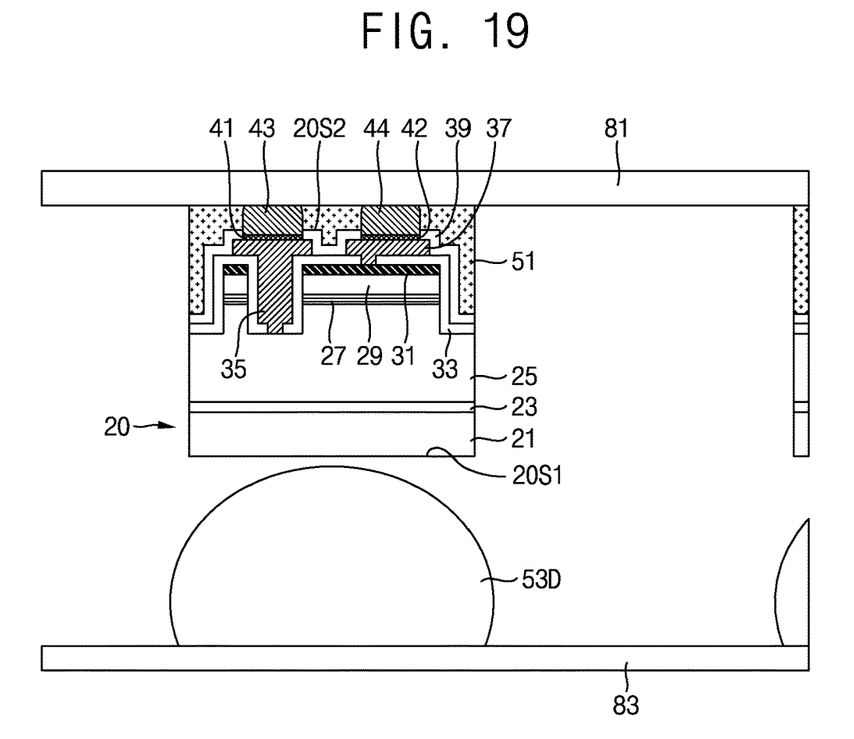

Referring to FIG. 19, each of the plurality of light-emitting chips 20 may be installed on a first auxiliary substrate 81. The top surfaces of the first light reflection pattern 51, the first terminal 43, and the second terminal 44 may be bonded to the first auxiliary substrate 81. A light-transmitting material 53D may be formed on a second auxiliary substrate 83. The light-transmitting material 53D may include a material different from that of the first light reflection pattern 51. In an exemplary embodiment, the light-transmitting material 53D may include $SiO_2$ or $MgF_2$. The light-transmitting material 53D may be a liquid or flexible material. The light-transmitting material 53D may have various shapes due to its viscosity, composition, and surface tension. In an exemplary embodiment, the light-transmitting material 53D may be formed in a hemispherical shape on the second auxiliary substrate 83. The light-transmitting material 53D may include a silicon resin.

Figure 20:
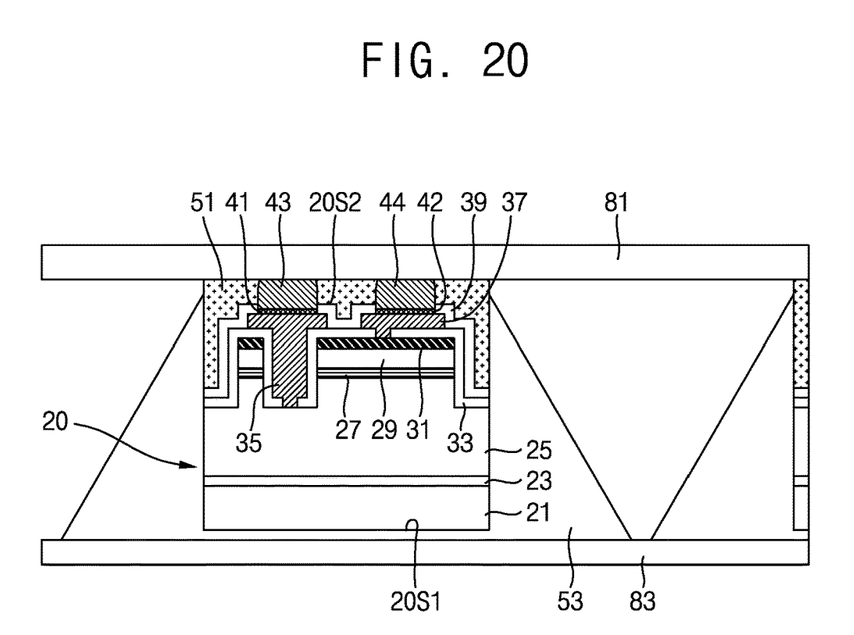

Referring to FIG. 20, the light-transmitting material 53D may be combined with the plurality of light-emitting chips 20 between the first auxiliary substrate 81 and the second auxiliary substrate 83 such that light-transmitting patterns 53 may be formed. The first surfaces 20S1 may be buried in the light-transmitting patterns 53. The light-transmitting patterns 53 may cover side surfaces of the plurality of light-emitting chips 20, and extend to side surfaces of the first light reflection patterns 51. The side surfaces of the plurality of light-emitting chips 20 may be completely covered by the light-transmitting patterns 53. The light-transmitting patterns 53 may be in direct contact with the side surfaces of the plurality of light-emitting chips 20 and the side surfaces of the first light reflection patterns 51. Uppermost ends of the light-transmitting patterns 53 may be formed at a higher level than the second surface 20S2. The uppermost ends of the light-transmitting patterns 53 may be formed between the second surface 20S2 and the first auxiliary substrate 81. The light-transmitting patterns 53 may have an increasing width toward the first surfaces 20S1. The light-transmitting patterns 53 may include outwardly inclined side surfaces.

As shown in FIGS. 1 to 8, the light-transmitting patterns 53 may have various shapes. In an exemplary embodiment, the light-transmitting patterns 53 may have various shapes due to the viscosity, composition, and surface tension of the light-transmitting material 53D. In an exemplary embodiment, the light-transmitting patterns 53 may be formed using an injection molding method, which will be omitted for brevity.

Figure 21:
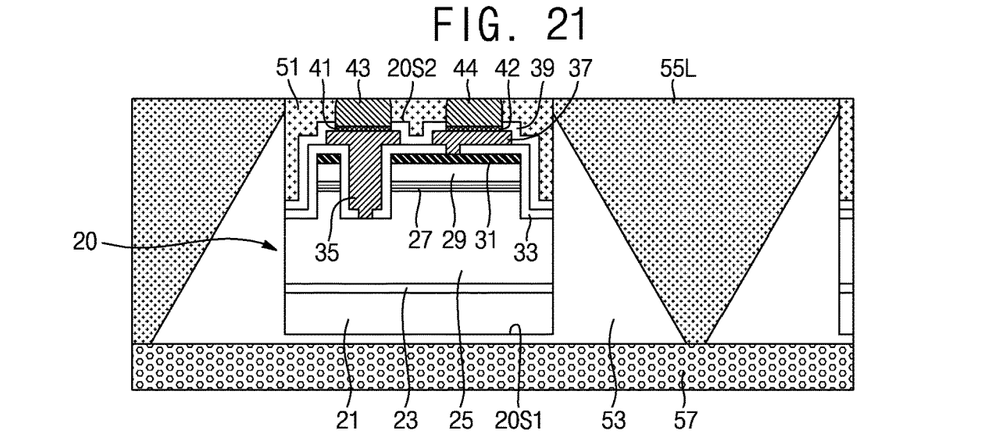

Referring to FIG. 21, the second auxiliary substrate 83 is removed, and a wavelength conversion layer 57 may be formed on the light-transmitting patterns 53. The first auxiliary substrate 81 is removed, and a second light reflection layer 55L may be formed on side surfaces of the light-transmitting patterns 53. The second light reflection layer 55L may be in direct contact with the side surfaces of the first light reflection patterns 51. The second light reflection layer 55L may be in direct contact with the side surfaces of the light-transmitting patterns 53.

The second light reflection layer 55L may include a material different from that of the light-transmitting patterns 53. According to exemplary embodiments, the second light reflection layer 55L may include $TiO_2$, $TaO_2$, $ZrO_2$, $SiO_2$, $Al_2O_3$, $Al(OH)_3$, $MgCO_3$, $ZnO_2$, $Nb_2O_5$, $MgO$, $Mg(OH)_2$, $SrO$, $In_2O_3$, $HFO$, $SeO$, $Y_2O_3$, $SiN$, $AlN$, $AlON$, $MgF_2$, or a combination thereof. In an exemplary embodiment, the second light reflection layer 55L may include $TiO_2$ having a lower refraction or refractive index than the first light reflection patterns 51. The second light reflection layer 55L may include a material layer having a reflectance of 91% to 97%. The second light reflection layer 55L may include a material having a higher reflectance than the first light reflection patterns 51. The second light reflection layer 55L may include $TiO_2$ having a lower strength than the first light reflection patterns 51. For example, a material such as WR-3100, WR-3110, WR-3120 (Dow Chemical Company), or a combination thereof may be used as a material for forming the second light reflection layer 55L. The wavelength conversion layer 57 may be formed by mixing a light-transmitting material and a wavelength conversion material. The wavelength conversion layer 57 may include a fluorescent layer. In an exemplary embodiment, the wavelength conversion layer 57 may include phosphorus (P). The wavelength conversion layer 57 may be attached in a film form.

Figure 22:
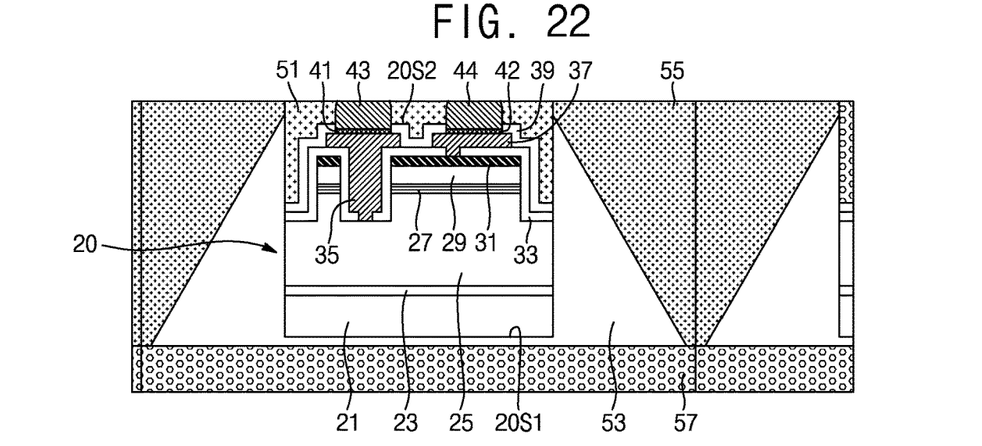

Referring to FIG. 22, the second light reflection layer 55L may be divided such that second light reflection patterns 55 may be formed. While the second light reflection layer 55L is divided, the wavelength conversion layer 57 may also be divided. The divided wavelength conversion layers 57 may be in direct contact with the second light reflection patterns 55 and the light-transmitting patterns 53. Side surfaces of the divided wavelength conversion layers 57 and the second light reflection patterns 55 may be substantially coplanar.

Figure 23:
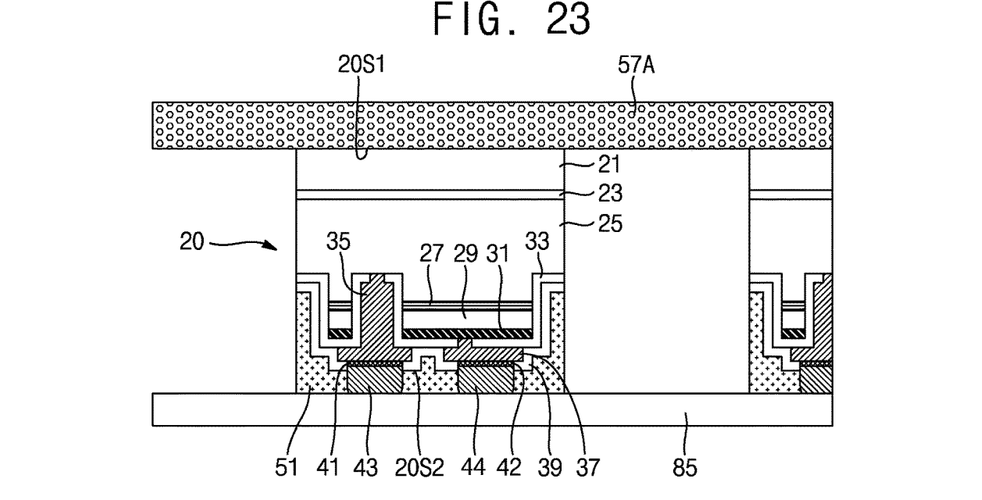
Figure 24:
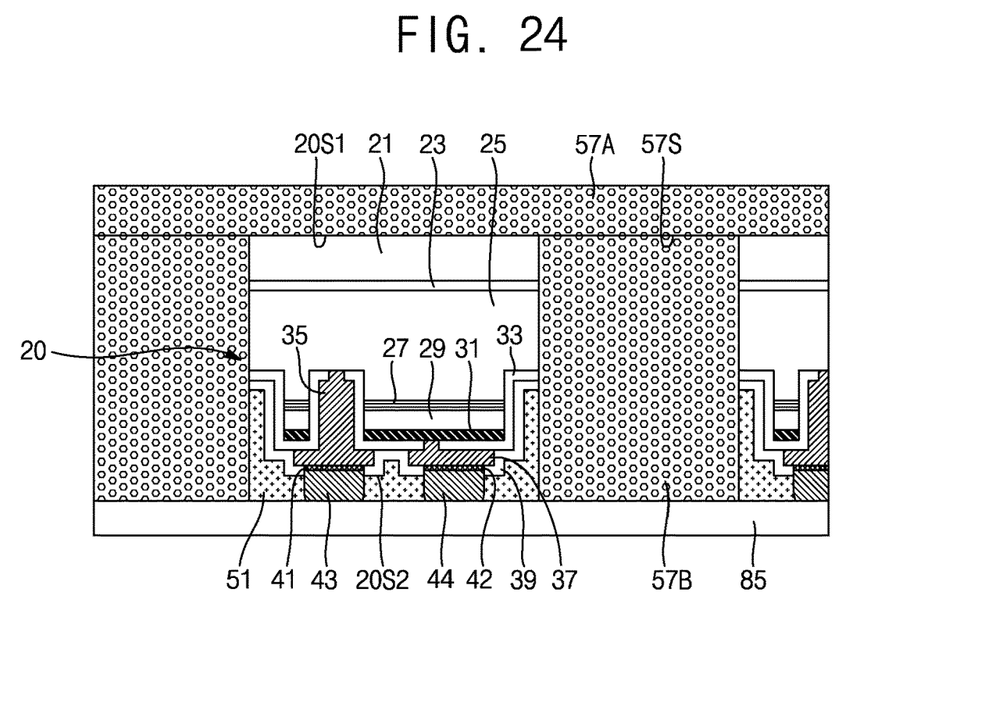
Figure 25:
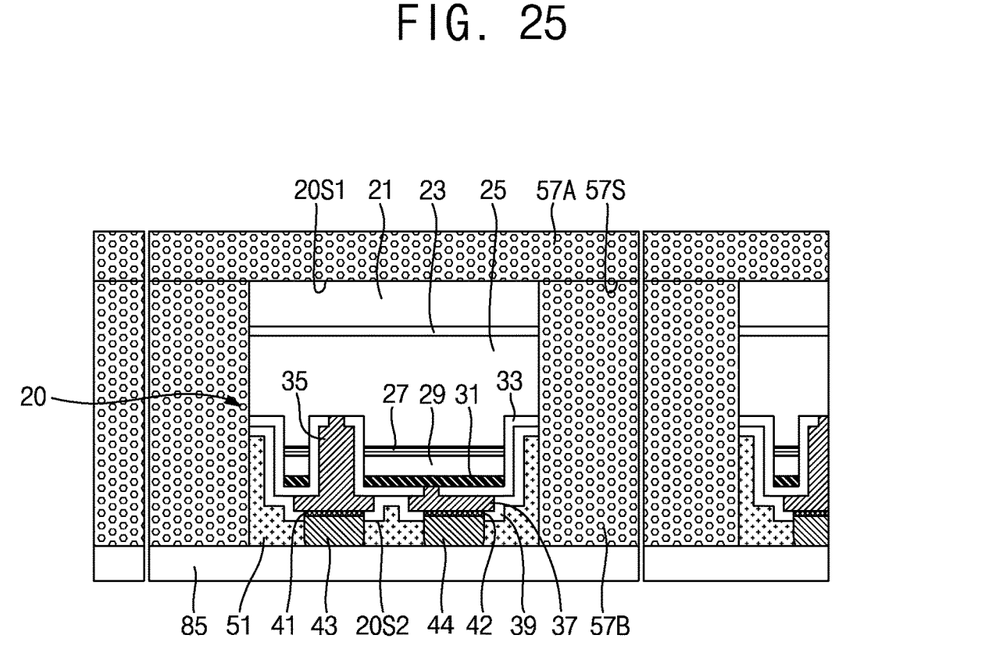

FIGS. 23 to 25 are cross-sectional views illustrating a method of fabricating a light-emitting device according to exemplary embodiments of the inventive concept.

Referring to FIG. 23, the plurality of light-emitting chips 20 may be installed on a third auxiliary substrate 85. The plurality of light-emitting chips 20 may be spaced apart from one another. A first wavelength conversion layer 57A may be formed on the plurality of light-emitting chips 20. Each of the plurality of light-emitting chips 20 may be disposed between the third auxiliary substrate 85 and the first wavelength conversion layer 57A. Surfaces of the first light reflection patterns 51, the first terminals 43, and the second terminals 44 may be bonded to the third auxiliary substrate 85. The first surfaces 20S1 may be in contact with the first wavelength conversion layer 57A. The first wavelength conversion layer 57A may be formed in a film form.

Referring to FIG. 24, a second wavelength conversion layer 57B may be formed on the side surfaces of the plurality of light-emitting chips 20 and the side surfaces of the first light reflection patterns 51. Gaps between the plurality of light-emitting chips 20 may be completely filled with the second wavelength conversion layer 57B. The second wavelength conversion layer 57B may be in contact with the first wavelength conversion layer 57A. An interface 57S may be formed between the first wavelength conversion layer 57A and the second wavelength conversion layer 57B. The interface 57S and the first surfaces 20S1 may be substantially coplanar. The second wavelength conversion layer 57B may be in direct contact with the side surfaces of the plurality of light-emitting chips 20 and the side surfaces of the first light reflection patterns 51.

Referring to FIG. 25, each of the first wavelength conversion layer 57A and the second wavelength conversion layer 57B may be divided. While the first wavelength conversion 57A and the second wavelength conversion 57B are divided, the third auxiliary substrate 85 may also be divided. Side surfaces of the divided first wavelength conversion layers 57A and the divided second wavelength conversion layers 57B may be substantially coplanar. The third auxiliary substrate 85 is removed such that bottom surfaces of the divided second wavelength conversion layer 57B, the first light reflection patterns 51, the first terminals 43, and the second terminals 44 may be exposed in substantially the same plane.

Figure 26:
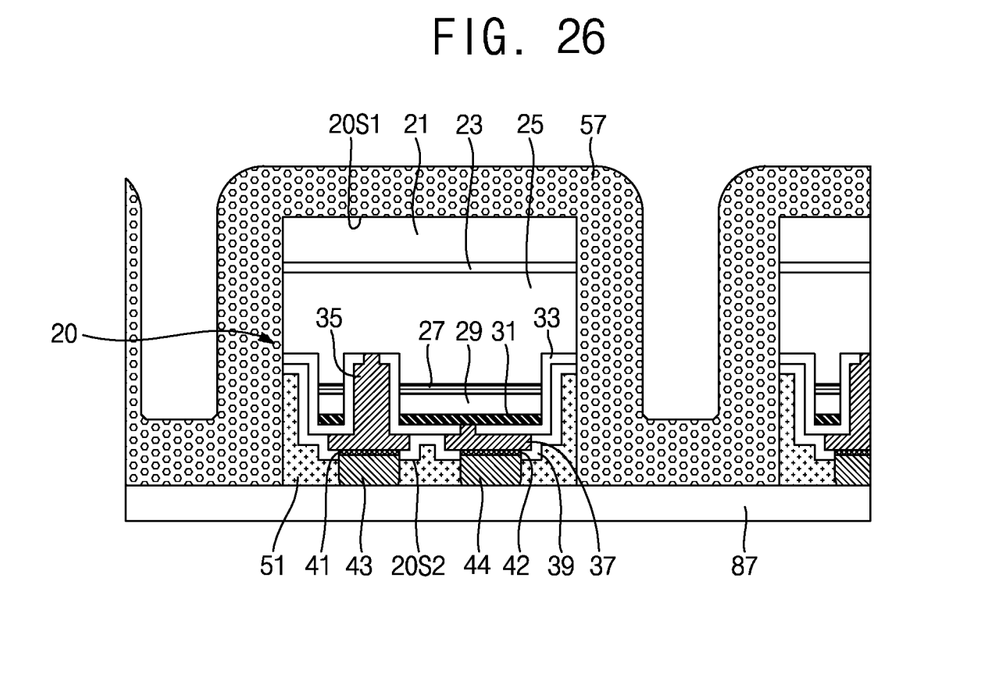
Figure 27:
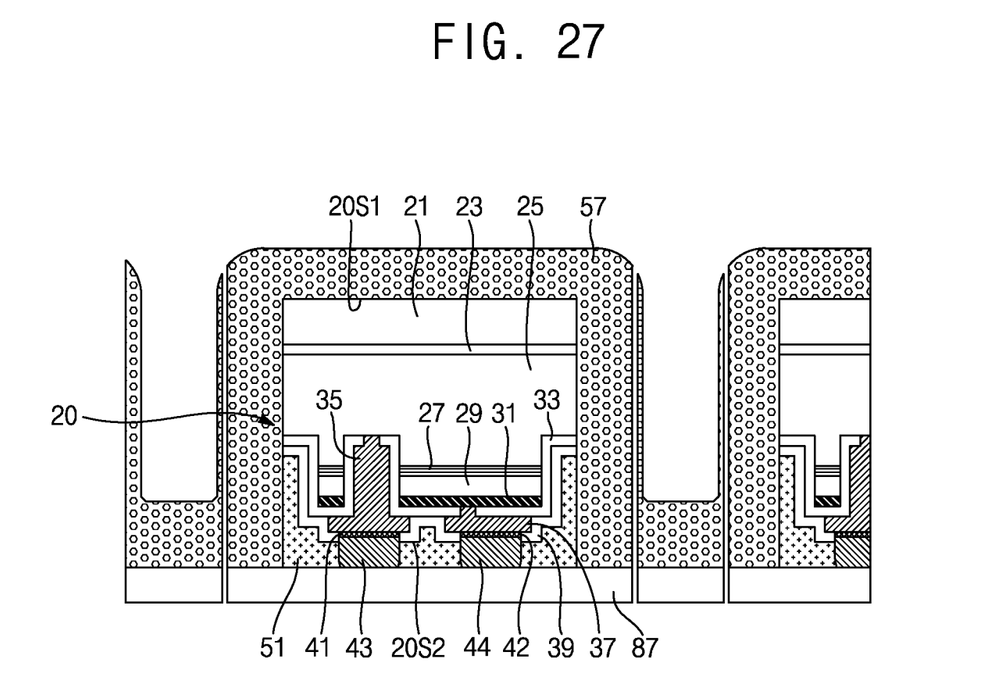

FIGS. 26 and 27 are cross-sectional views illustrating a method of fabricating a light-emitting device according to exemplary embodiments of the inventive concept.

Referring to FIG. 26, the plurality of light-emitting chips 20 may be installed on a fourth auxiliary substrate 87. The plurality of light-emitting chips 20 may be spaced apart from one another. Surfaces of the first light reflection patterns 51, the first terminals 43, and the second terminals 44 may be bonded to the fourth auxiliary substrate 87. A wavelength conversion layer 57 may be formed on the side surfaces of the first light reflection patterns 51 and the first surfaces 20S1 and the side surfaces of the plurality of light-emitting chips 20. The wavelength conversion layer 57 may be in direct contact with the side surfaces of the first light reflection patterns 51 and the first surfaces 20S1 and the side surfaces of the plurality of light-emitting chips 20.

Referring to FIG. 27, the wavelength conversion layer 57 may be divided. While the wavelength conversion layer 57 is divided, the fourth auxiliary substrate 87 may also be divided. The fourth auxiliary substrate 87 is removed such that bottom surfaces of the wavelength conversion layer 57, the first light reflection patterns 51, the first terminals 43, and the second terminals 44 may be exposed in substantially the same plane.

According to the exemplary embodiments of the inventive concept, a first light reflection pattern, a light-transmitting pattern, and a second light reflection pattern are provided. The light-transmitting pattern is formed between side surfaces of a light-emitting chip and the second light reflection pattern, and extends between the first light reflection pattern and the second light reflection pattern. A combination of the first light reflection pattern, the light-transmitting pattern, and the second light reflection pattern can maximize the reflection efficiency of light emitted from the light-emitting chip. It is possible to implement a light-emitting device that is advantageous for high-density integration and also has an improved luminous flux.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A light-emitting device comprising:
    a light-emitting chip comprising a first surface and a second surface opposite to the first surface;
    a first light reflection pattern formed on the second surface;
    a plurality of terminals connected to the light-emitting chip by passing through the first light reflection pattern;
    a second light reflection pattern disposed on an outer side surface of the first light reflection pattern;
    a light-transmitting pattern formed between the light-emitting chip and the second light reflection pattern, and extending between the first light reflection pattern and the second light reflection pattern; and
    a wavelength conversion layer formed on the first surface of the light-emitting chip.

2. The light-emitting device of claim 1, wherein the second light reflection pattern is in direct contact with the first light reflection pattern.

3. The light-emitting device of claim 1, wherein one end of the light-transmitting pattern is positioned between the outer side surface of the first light reflection pattern and the second light reflection pattern, and formed at a level between the second surface of the light-emitting chip and a bottom surface of the first light reflection pattern.

4. The light-emitting device of claim 1, wherein one end of the light-transmitting pattern is adjacent to a lower end of the outer side surface of the first light reflection pattern.

5. The light-emitting device of claim 1, wherein an outer side surface of the light-emitting chip and the outer side surface of the first light reflection pattern are substantially coplanar.

6. The light-emitting device of claim 1, wherein bottom surfaces of the first light reflection pattern, the plurality of terminals, and the second light reflection pattern are substantially coplanar.

7. The light-emitting device of claim 1, wherein the second light reflection pattern comprises a material having a higher reflectance than the first light reflection pattern.

8. The light-emitting device of claim 1, wherein the second light reflection pattern comprises a material with a lower strength than the first light reflection pattern.

9. The light-emitting device of claim 1, wherein an interface between the light-transmitting pattern and the second light reflection pattern is inclined by 45 degrees to 70 degrees with respect to the outer side surface of the first light reflection pattern.

10. A light-emitting device comprising:
    a light-emitting chip comprising a first surface and a second surface opposite to the first surface;
    a first light reflection pattern formed on the second surface;
    a plurality of terminals connected to the light-emitting chip by passing through the first light reflection pattern;
    a second light reflection pattern disposed on an outer side surface of the first light reflection pattern; and
    a wavelength conversion layer formed on the first surface of the light-emitting chip,
    wherein bottom surfaces of the first light reflection pattern and the plurality of terminals are substantially coplanar,
    wherein an outer side surface of the light-emitting chip and the outer side surface of the first light reflection pattern are substantially coplanar, and
    wherein the second light reflection pattern comprises at least a portion that is in contact with and extends on the outer side surface of the first light reflection pattern.

11. The light-emitting device of claim 10, further comprising a light-transmitting pattern formed between the second light reflection pattern and the light-emitting chip, and extending between the first light reflection pattern and the second light reflection pattern,
    wherein the wavelength conversion layer extends onto the second light reflection pattern and the light-transmitting pattern.

12. The light-emitting device of claim 10, wherein the second light reflection pattern comprises $TiO_2$ having a higher reflectance than the first light reflection pattern.

* * * * *